(12) United States Patent
Lee

(10) Patent No.: US 11,145,360 B2
(45) Date of Patent: Oct. 12, 2021

(54) SEMICONDUCTOR MEMORY DEVICE AND MANUFACTURING METHOD THEREOF

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/925,925

(22) Filed: Jul. 10, 2020

(65) Prior Publication Data

US 2021/0217468 A1 Jul. 15, 2021

(30) Foreign Application Priority Data

Jan. 15, 2020 (KR) .................. 10-2020-0005635

(51) Int. Cl.
*G11C 16/04* (2006.01)
*G11C 11/413* (2006.01)
*H01L 27/11* (2006.01)

(52) U.S. Cl.
CPC ............ *G11C 11/413* (2013.01); *H01L 27/11* (2013.01)

(58) Field of Classification Search
CPC .............................. H01L 27/11524

USPC ..................................... 365/185.17
See application file for complete search history.

(56) References Cited

U.S. PATENT DOCUMENTS

2017/0213843 A1* 7/2017 Choi .................. H01L 28/00
2017/0287929 A1 10/2017 Kim et al.
2018/0366483 A1 12/2018 Choi

* cited by examiner

*Primary Examiner* — Hoai V Ho
(74) *Attorney, Agent, or Firm* — William Park & Associates Ltd.

(57) ABSTRACT

There are provided a semiconductor memory device and a manufacturing method thereof. The semiconductor memory device includes: a source layer; a channel structure extending in a first direction from within the source layer; a source-channel contact layer surrounding the channel structure on the source layer; a first select gate layer overlapping with the source-channel contact layer and surrounding the channel structure; a stack including interlayer insulating layers and conductive patterns that are alternately stacked in the first direction and surrounding the channel structure, the stack overlapping with the first select gate layer; and a first insulating pattern that is formed thicker between the first select gate layer and the channel structure than between the stack and the channel structure.

10 Claims, 19 Drawing Sheets

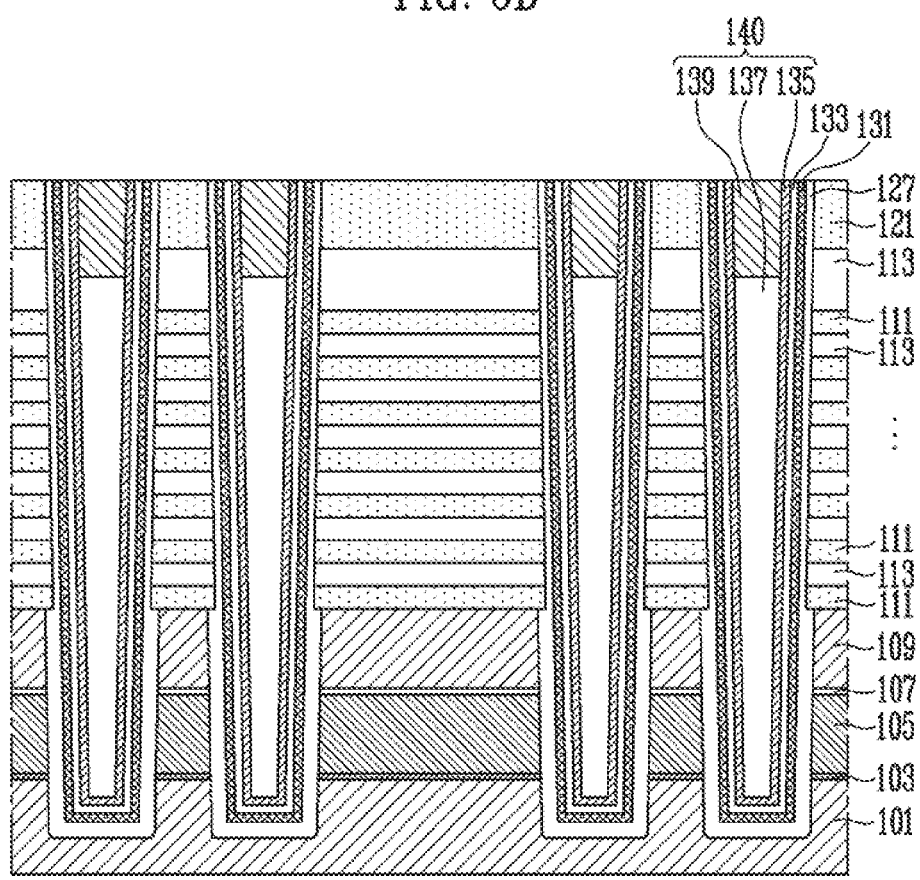

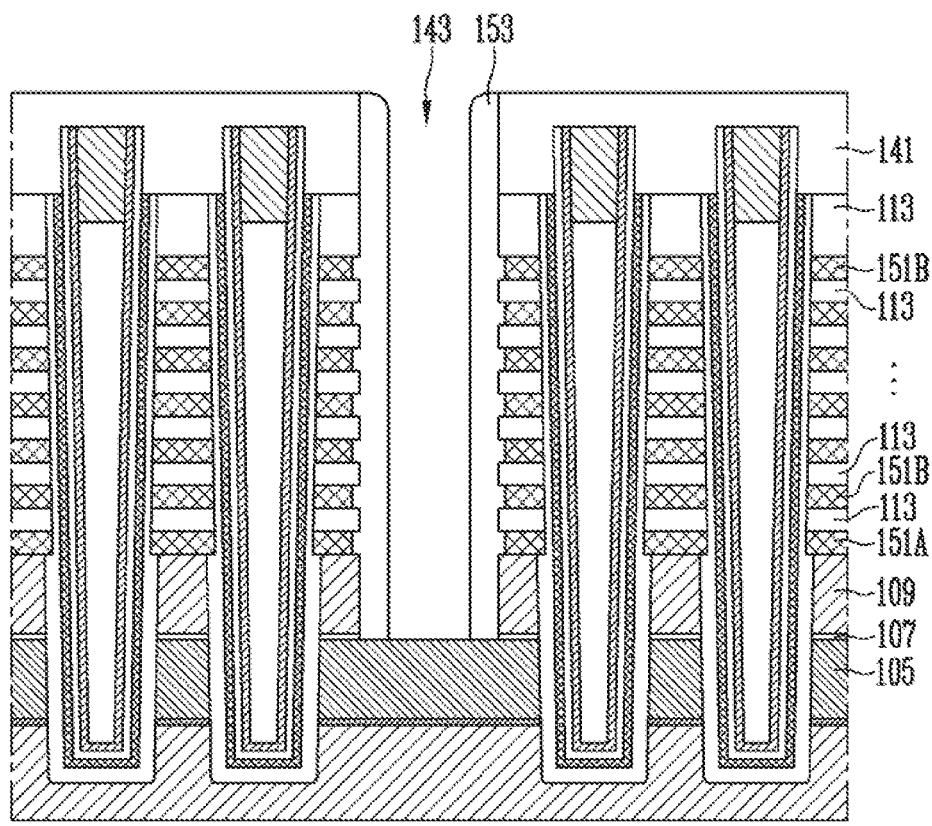

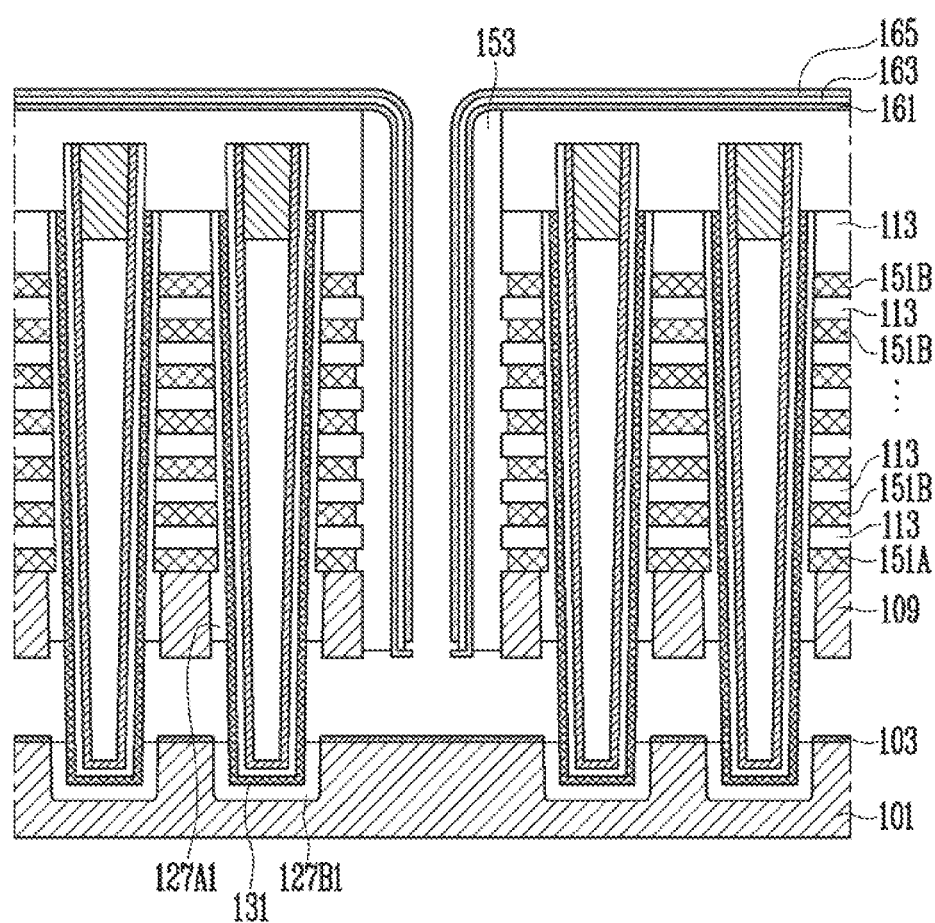

SEMICONDUCTOR MEMORY DEVICE AND MANUFACTURING METHOD THEREOF

CROSS-REFERENCE TO RELATED APPLICATION

The present application claims priority under 35 U.S.C. § 119(a) to Korean patent application number 10-2020-0005635, filed on Jan. 15, 2020, in the Korean Intellectual Property Office, the entire disclosure of which is incorporated herein by reference.

BACKGROUND

1. Technical Field

Various embodiments of the present disclosure relate to a semiconductor memory device and a manufacturing method thereof, and more particularly, to a three-dimensional semiconductor memory device and a manufacturing method thereof.

2. Related Art

A semiconductor memory device may include a plurality of memory cells that are capable of storing data. A three-dimensional semiconductor memory device may include memory cells that are three-dimensionally arranged.

The data that is stored in the memory cells of the three-dimensional semiconductor memory device may be erased by a Gate Induced Drain Leakage (GIDL) erase operation. The GIDL erase operation may be performed to inject holes into channels of the memory cells by generating the GIDL current.

SUMMARY

In accordance with an embodiment of a semiconductor memory device may include: a source layer; a channel structure extending in a first direction from within the source layer; a source-channel contact layer surrounding the channel structure on the source layer; a first select gate layer overlapping with the source-channel contact layer and surrounding the channel structure; a stack including interlayer insulating layers and conductive patterns that are alternately stacked in the first direction and surrounding the channel structure, the stack overlapping with the first select gate layer; and a first insulating pattern that is formed thicker between the first select gate layer and the channel structure than between the stack and the channel structure.

In accordance with an embodiment of a method of manufacturing a semiconductor memory device may include: forming a sacrificial source layer on a source layer; forming a first select gate layer on the sacrificial source layer; alternately stacking a sacrificial layer and an interlayer insulating layer on the first select gate layer; forming a hole in which an insulating structure covers a surface within the hole, wherein the hole penetrates the interlayer insulating layer, the sacrificial layer, the first select gate layer, and the sacrificial source layer, and extends into the source layer; sequentially stacking a data storage layer and a tunnel insulating layer on the insulating structure; forming a channel structure on the tunnel insulating layer by filling the hole with the channel structure; removing the sacrificial source layer; and expanding the insulating structure by selectively oxidizing the first select gate layer from a bottom surface of the first select gate layer.

DETAILED DESCRIPTION

The specific structural or functional descriptions disclosed herein are merely illustrative for the purpose of describing embodiments according to the concept of the present disclosure. The embodiments may be implemented in various forms, and should not be construed as being limited to the specific embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments of the present disclosure provide a semiconductor memory device and a manufacturing method thereof that may improve operational reliability.

Figure 1:
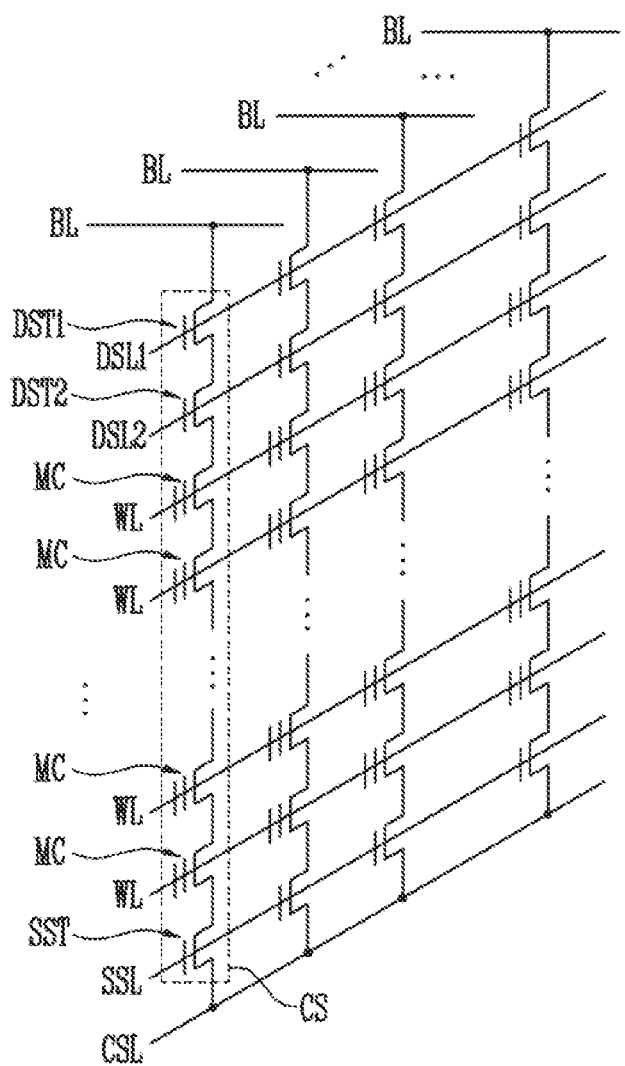
FIG. 1 is a circuit diagram illustrating a semiconductor memory device, in accordance with an embodiment of the present disclosure.

FIG. 1 is a circuit diagram illustrating a semiconductor memory device, in accordance with an embodiment of the present disclosure.

Referring to FIG. 1, a semiconductor memory device may include a plurality of cell strings CS that are connected to a common source line CSL and bit lines BL.

Each of the cell strings CS may include a plurality of memory cells MC, a source select transistor SST, and drain select transistors DST1 and DST2, connected in series.

The source select transistor SST may control the electrical connection between a cell string CS and the common source line CSL. The cell string CS may include one source select transistor or two or more source select transistors that are connected in series. For example, FIG. 1 illustrates a case when the cell string CS includes one source select transistor SST that is connected between the memory cells MC and the common source line CSL.

The drain select transistors DST1 and DST2 may control the electrical connection between a cell string CS and the corresponding bit line BL. The cell string CS may include one drain select transistor or two or more drain select transistors that are connected in series. For example, FIG. 1 illustrates a case when the cell string CS includes a first drain select transistor DST1 and a second drain select transistor DST2 that are connected in series.

The cell string CS may be connected to a source select line SSL, word lines WLs, and drain select lines DSL1 and DSL2. The source select line SSL may be connected to a gate electrode of the source select transistor SST, and the word lines WLs may be respectively connected to gate electrodes of the memory cells MC. The drain select lines DSL1 and DSL2 may be respectively connected to gate electrodes of the drain select transistors DST1 and DST2 that are included in the cell string CS.

For convenience of recognition, the cell strings CS that are connected to the common source line CSL and forming one row are shown. However, cell strings may be connected in parallel to the common source line CSL and may be arranged in two or more rows and in two or more columns. The cell strings of each column may be connected, in parallel, to the corresponding bit line BL.

Figure 2:
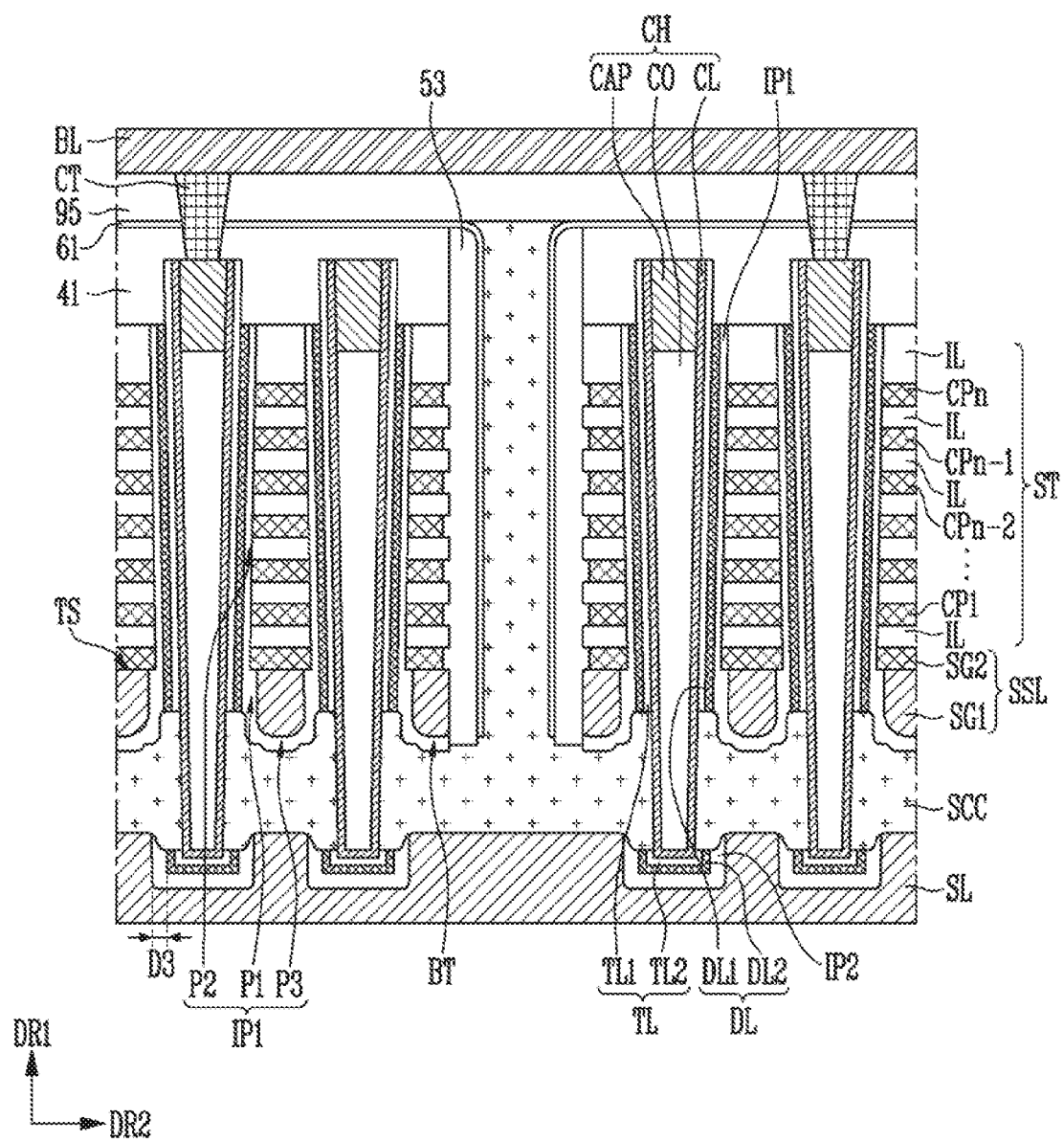
FIG. 2 is a sectional view illustrating a cell array of the semiconductor memory device, in accordance with an embodiment of the present disclosure.

FIG. 2 is a sectional view illustrating a cell array of the semiconductor memory device, in accordance with an embodiment of the present disclosure.

Referring to FIG. 2, the semiconductor memory device may include a source layer SL, channel structures CH that overlaps with the source layer SL and extends in a first direction DR1, a source-channel contact layer SCC that connects the source layer SL and the channel structures CH, the source select lines SSL that surround the channel structures CH, stacks ST that surround the channel structures CH on the source select lines SSL, and the bit line BL that overlaps with the stacks ST and extending in a second direction DR2.

The source layer SL may be configured with the common source line CSL, shown in FIG. 1. The source layer SL may include a doped semiconductor layer with an n-type impurity. In an embodiment, the source layer SL may include an n-type doped silicon.

The source-channel contact layer SCC may be in contact with the source layer SL and may extend along the top surface of the source layer SL. The source-channel contact layer SCC may extend between adjacent stacks ST. The source-channel contact layer SCC may surround the channel structures CH between the source layer SL and the source select lines SSL, and the source-channel contact layer SCC may be in contact with a sidewall of each of the channel structures CH. The source-channel contact layer SCC may include a doped semiconductor layer with an n-type impurity. In an embodiment, the source-channel contact layer SCC may include an n-type doped silicon.

During an erase operation of the semiconductor memory device, Gate Induced Drain Leakage (GIDL) may be generated at the source-channel contact layer SCC. The source-channel contact layer SCC may extend between each of the source select lines SSL and the channel structures CH. Accordingly, a junction overlap region that overlaps the source select lines SSL may be formed, thereby ensuring a GIDL current.

The source select lines SSL may be spaced apart from each other in the second direction DR2 at the same level. Each of the source select lines SSL may include a first select gate layer SG1 and a second select gate layer SG2 that are stacked in the first direction DR1.

The first select gate layer SG1 may overlap with the source-channel contact layer SCC, and the first select gate layer SG1 may surround the corresponding channel structures CH. The second select gate layer SG2 may surround the corresponding channel structures CH, between the first select gate layer SG1 and the stack ST.

The first select gate layer SG1 may be selectively oxidized during the manufacturing process of the semiconductor memory device, and the first select gate layer SG1 may include a material with a high oxidation rate. In an embodiment, the first select gate layer SG1 may include silicon.

The second select gate layer SG2 may include a metal with lower resistance than the first select gate layer SG1. In an embodiment, the second select gate layer SG2 may include a metal and a diffusion barrier layer. The metal may include tungsten. The diffusion barrier layer may include titanium (Ti) and titanium nitride (TiN), or the diffusion barrier layer may include titanium nitride (TiN).

Each of the stacks ST may overlap with its corresponding source select line SSL. Each of the stacks ST may include interlayer insulating layers IL and conductive patterns CP1 to CPn (n is a natural number) that are alternately disposed in the first direction DR1. Each of the interlayer insulating layers IL and the conductive patterns CP1 to CPn (n is a natural number) may surround its corresponding channel structures CH.

At least one conductive pattern that is adjacent to the bit line BL among the conductive patterns CP1 to CPn may be used as a drain select line. In an embodiment, the n-th conductive pattern CPn that is adjacent to the bit line BL and the n−1th conductive pattern CPn−1 that is disposed under the n-th conductive pattern CPn may form the drain select lines DSL1 and DSL2, respectively, as described with reference to FIG. 1. The conductive patterns CP1 to CPn−2 that are disposed between the drain select lines DSL1 and DSL2 and the source select line SSL may respectively form the word lines WL as described with reference to FIG. 1. However, the embodiment of the present disclosure is not limited thereto. In an embodiment, among the conductive patterns CP1 to CPn−2, at least one conductive pattern that is adjacent to the source select line SSL may form an upper source select line, and the conductive patterns between the upper source select line and the drain select lines may form word lines.

The conductive patterns CP1 to CPn may be formed of the same conductive material. Each of the conductive patterns CP1 to CPn may include the same conductive material as the second select gate layer SG2. In an embodiment, each of the conductive patterns CP1 to CPn may include a metal and a diffusion barrier layer.

The channel structures CH may extend from the inside of the source layer SL in the first direction DR1. Each of the channel structures CH may include a sidewall that is in contact with the source-channel contact layer SCC. Each of the channel structures CH may include a region that is surrounded by a first insulating pattern IP1 and a region that is surrounded by a second insulating pattern IP2. The first insulating pattern IP1 and the second insulating pattern IP2 may be separated from each other by the source-channel contact layer SCC.

The first insulating pattern IP1 may form a source gate insulating layer, a blocking insulating layer, and a drain gate insulating layer. The source gate insulating layer of the first insulating pattern IP1 may be disposed between the source select line SSL and the source-channel contact layer SCC, and the source gate insulating layer of the first insulating pattern IP1 may extend between the source select line SSL and each of the channel structures CH. The blocking insulating layer of the first insulating pattern IP1 be disposed between each of the word lines (e.g., CP1 to CPn−2) and each of the channel structures CH. The drain gate insulating layer of the first insulating pattern IP1 may extend between each of the drain select lines (e.g., CPn−1 and CPn) and each of the channel structures CH.

The first insulating pattern IP1 may include a first portion P1, a second portion P2, and a third portion P3. The first portion P1 of the first insulating pattern IP1 may be disposed between the first select gate layer SG1 and each of the channel structures CH. The second portion P2 of the first insulating pattern IP1 may extend from the first portion P1 and may be disposed between the second select gate layer SG2 and each of the channel structures CH. The second portion P2 of the first insulating pattern IP1 may extend between each of the stacks ST and each of the channel structures CH. The third portion P3 of the first insulating pattern IP1 may extend from the first portion P1 and may be disposed between the first select gate layer SG1 and the source-channel contact layer SCC. The first insulating pattern IP1 may include oxides of various materials. In an embodiment, the first portion P1 and the third portion P3 may include an oxide of silicon, and the second portion P2 may include an oxide of a nitride layer.

The second insulating pattern IP2 may be disposed between the source layer SL and each of the channel structures CH. The second insulating pattern IP2 may include an oxide. In an embodiment, the second insulating pattern IP2 may include an oxide of silicon.

Each of the channel structures CH may be surrounded by a tunnel insulating layer TL and a data storage layer DL. The data storage layer DL may be formed of a material layer that is capable of storing data. In an embodiment, the data storage layer may be formed of a material layer that is capable of storing data that is changed using Fowler-Nordheim tunneling. The data storage layer may include a nitride layer that is capable of charge trapping. However, the present disclosure is not limited thereto. In an embodiment, the data storage layer may include a variable resistance material. The tunnel insulating layer TL may include a silicon oxide layer that is capable of charge tunneling.

The tunnel insulating layer TL may be separated into a first tunnel insulating pattern TL1 and a second tunnel insulating pattern TL2 by the source-channel contact layer SCC, and the data storage layer DL may be separated into a first data storage pattern DL1 and a second data storage pattern DL2 by the source-channel contact layer SCC.

The first tunnel insulating pattern TL1 and the first data storage pattern DL1 may be disposed between the first insulating pattern IP1 and each of the channel structures CH on the source-channel contact layer SCC. The first tunnel insulating pattern TL1 may be disposed between the first data storage pattern DL1 and each of the channel structures CH.

The second tunnel insulating pattern TL2 and the second data storage pattern DL2 may be disposed between the second insulating pattern IP2 and each of the channel structures CH under the source-channel contact layer SCC. The second tunnel insulating pattern TL2 may be disposed between the second data storage pattern DL2 and each of the channel structures CH.

The source-channel contact layer SCC may extend between each of the source select lines SSL and the channel structures CH to secure a junction overlap region. Accordingly, the source-channel contact layer SCC may have a shape that protrudes toward the first data storage pattern DL1 and the first tunnel insulating pattern TL1. In this case, the source-channel contact layer SCC may protrude toward the second data storage pattern DL2 and the second tunnel insulating pattern TL2.

An upper surface TS of the first select gate layer SG1 that faces the stack ST may be disposed closer to the stack ST than an interface between the source-channel contact layer SCC and each of the first tunnel insulating pattern TL1 and the first data storage pattern DL1. Thus, even if the source-channel contact layer SCC extends between the first select gate layer SG1 and the channel structures CH to secure a stable junction overlap region, an off characteristic of the source select transistors that are connected to the source select lines SSL may be secured. Accordingly, the operational reliability of the semiconductor memory device may be secured without increasing the number of stacks of the source select transistors that are disposed between the common source line CSL and the word lines WLs that are shown in FIG. 1.

Each of the channel structures CH may include a channel layer CL, a core insulating layer CO, and a capping semiconductor layer CAP. The core insulating layer CO and the capping semiconductor layer CAP may be disposed in a center region of the corresponding channel structure. The capping semiconductor layer CAP may overlap with the core insulating layer CO. The capping semiconductor layer CAP may include a doped semiconductor layer. In an embodiment, the capping semiconductor layer CAP may include a doped silicon with an n-type impurity. The channel layer CL may surround a sidewall of the capping semiconductor layer CAP and a sidewall of the core insulating layer CO. The channel layer CL may extend onto a surface of the core insulating layer CO that faces the source layer SL. The channel layer CL may be used as a channel region of the cell string CS that is described with reference to FIG. 1. The channel layer CL may be formed of a semiconductor layer.

Each of the stacks ST and the channel structures CH may be covered with a first upper insulating layer 41. Sidewalls of each of the stacks ST may be covered with a spacer insulating layer 53 that extends in the first direction DR1. The spacer insulating layer 53 may extend to cover a sidewall of the corresponding source select line SSL.

The spacer insulating layer 53 and the source-channel contact layer SCC may extend to penetrate the first upper insulating layer 41. An etching barrier layer 61 may remain between the spacer insulating layer 53 and the source-channel contact layer SCC. The etching barrier layer 61 may extend to cover the first upper insulating layer 41, The etching barrier layer 61 may include nitride.

The etching barrier layer 61 and the source-channel contact layer SCC may be covered with a second upper insulating layer 95. The second upper insulating layer 95, the etching barrier layer 61, and the first upper insulating layer 41 may be penetrated by contact plugs CT.

Each of the contact plugs CT may be connected to the corresponding channel structure CH. The bit line BL may be formed on the second upper insulating layer 95. The bit line BL may be electrically connected to the corresponding channel structures CH through the contact plugs CT.

Figure 3:
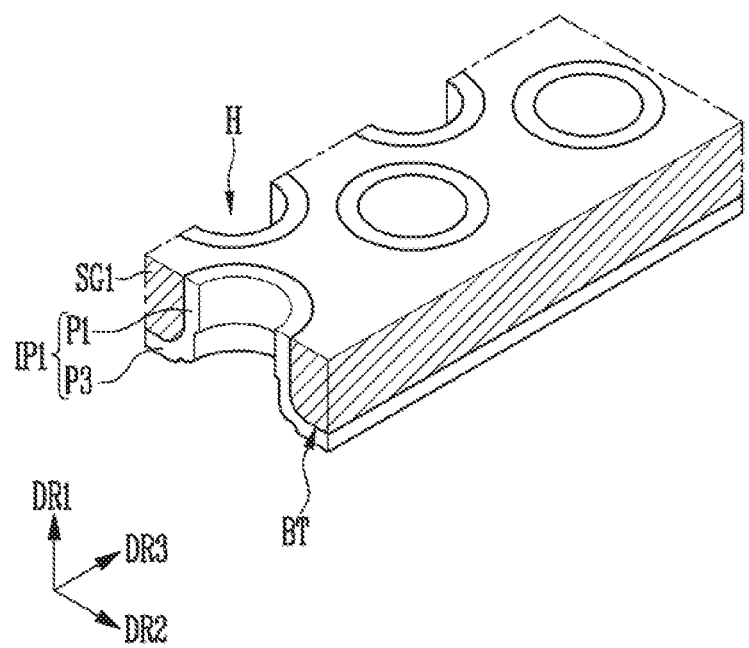
FIG. 3 is a perspective view illustrating a first select gate layer and a first insulating pattern shown in FIG. 2.
Figure 4:
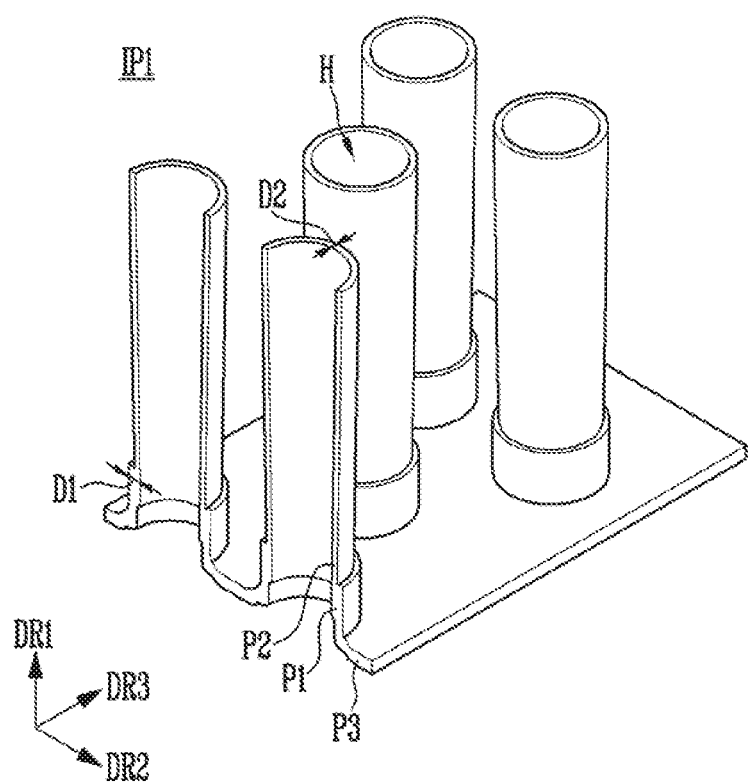
FIG. 4 is a perspective view illustrating a first insulating pattern shown in FIG. 2.

FIG. 3 is a perspective view illustrating a first select gate layer SG1 and a first insulating pattern IP1 shown in FIG. 2. FIG. 4 is a perspective view illustrating the first insulating pattern IP1 shown in FIG. 2.

Referring to FIG. 3, the third portion P3 of the first insulating pattern IP1 may extend along a bottom surface BT of the first select gate layer SG1 that faces the source layer SL as shown in FIG. 2. In an embodiment, the third portion P3 of the first insulating pattern IP1 may extend in the second direction DR2 and a third direction DR3.

The first insulating pattern IP1 may include a plurality of first portions P1 that extend in the first direction DR1 from the third portion P3. The first direction DR1, the second direction DR2, and the third direction DR3 may correspond to the x axis, the y axis, and the z axis of the XYZ coordinate system. This is to say that the first direction DR1, the second direction DR2, and the third direction DR3 may be perpendicular to each other and each may correspond to any of the x, y, and z axes based on the orientation. The first portions P1 may penetrate the first select gate layer SG1.

Referring to FIGS. 3 and 4, the first insulating pattern IP1 may include second portions P2 that respectively extend in the first direction DR1 from the first portions P1.

A hole H may be defined in a center region of each of the first and second portions P1 and P2. The hole H may be filled with the first data storage pattern DL1, the first tunnel insulating pattern TL1, and the channel structure CH as described with reference to FIG. 2.

Each of the first portions P1 and the second portions P2 may include an oxide. The first portions P1 may be formed by oxidizing a conductive material for the first select gate layer SG1, and the second portions P2 may be formed by oxidizing a material with a lower oxidation rate than the first select gate layer SG1. A first thickness D1 of each of the first portions P1 may be thicker than a second thickness D2 of each of the second portions P2. In an embodiment, each of the first portions P1 of the first insulating pattern IP1 that is formed to have a relatively large thickness may extend toward the channel structure CH to be overlapped by the stack ST as shown in FIG. 2.

Referring to FIGS. 2 to 4, the third portion P3 of the first insulating pattern IP1 may be formed by oxidizing a conductive material for the first select gate layer SG1. A portion of the third portion P3 may be etched due to an etching process to secure a space in which the source-channel contact layer SCC is to be disposed, and thus, may have an uneven surface. The uneven surface of the third portion P3 may be in contact with the source-channel contact layer SCC.

Referring to FIGS. 2 and 4, the second insulating pattern IP2 may be formed by oxidizing a conductive material for the source layer SL. The source layer SL may include a material with a higher oxidation rate than the material layer for the second portions P2. A third thickness D3 of the second insulating pattern IP2 may be greater than the second thickness D2.

Figure 5A:
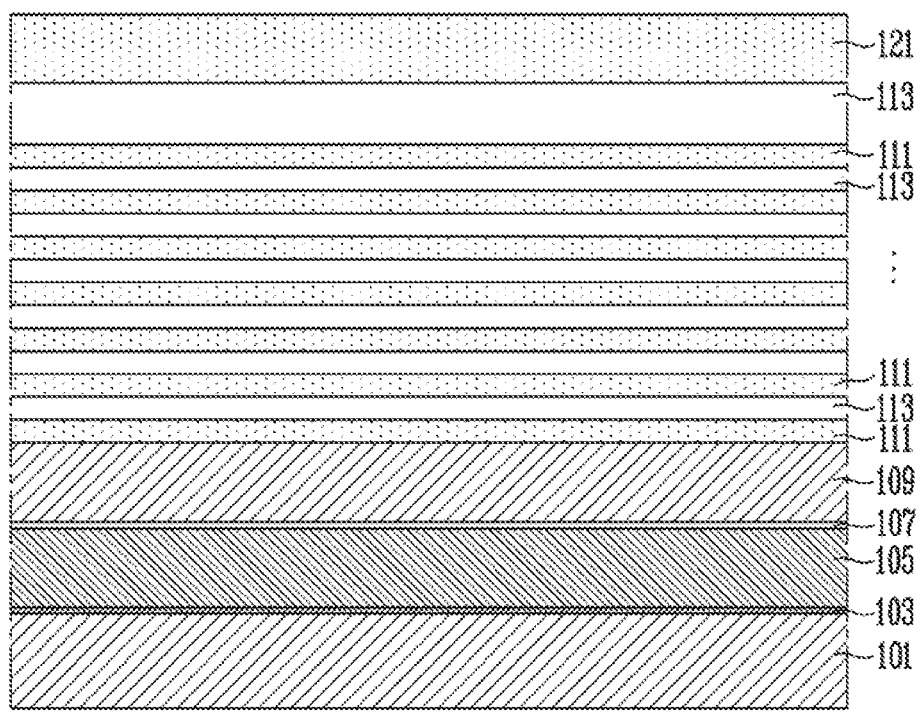
FIGS. 5A to 5N are sectional views illustrating a manufacturing method of a semiconductor memory device, in accordance with an embodiment of the present disclosure.
Figure 5B:
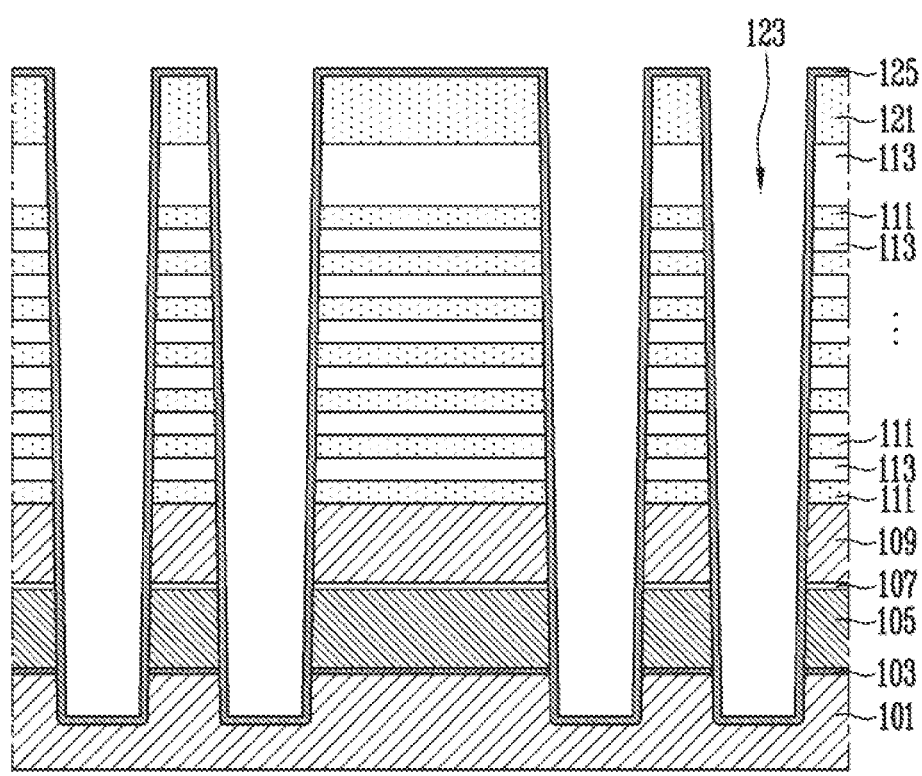
Figure 5C:
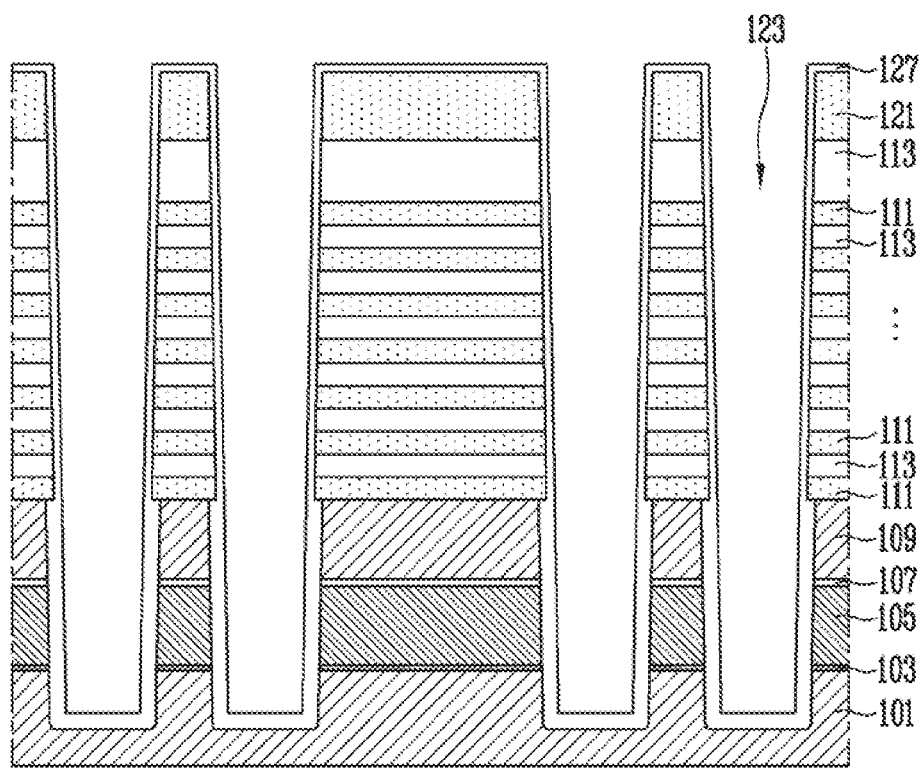
Figure 5E:
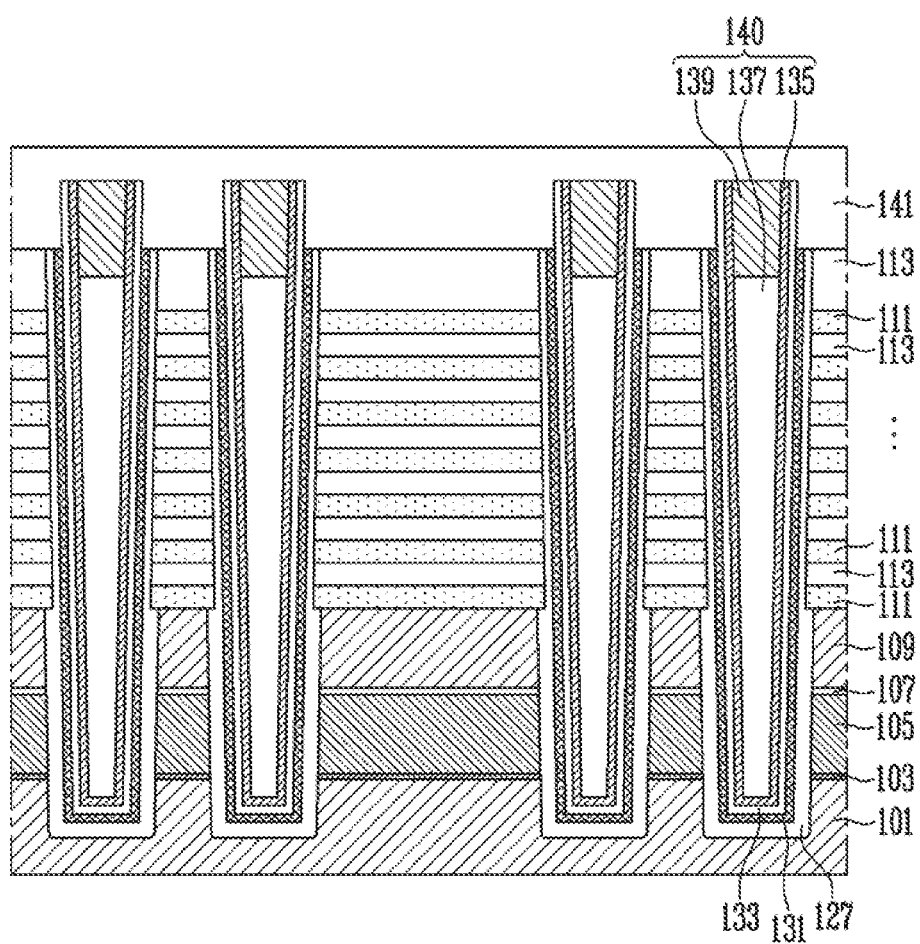
Figure 5F:
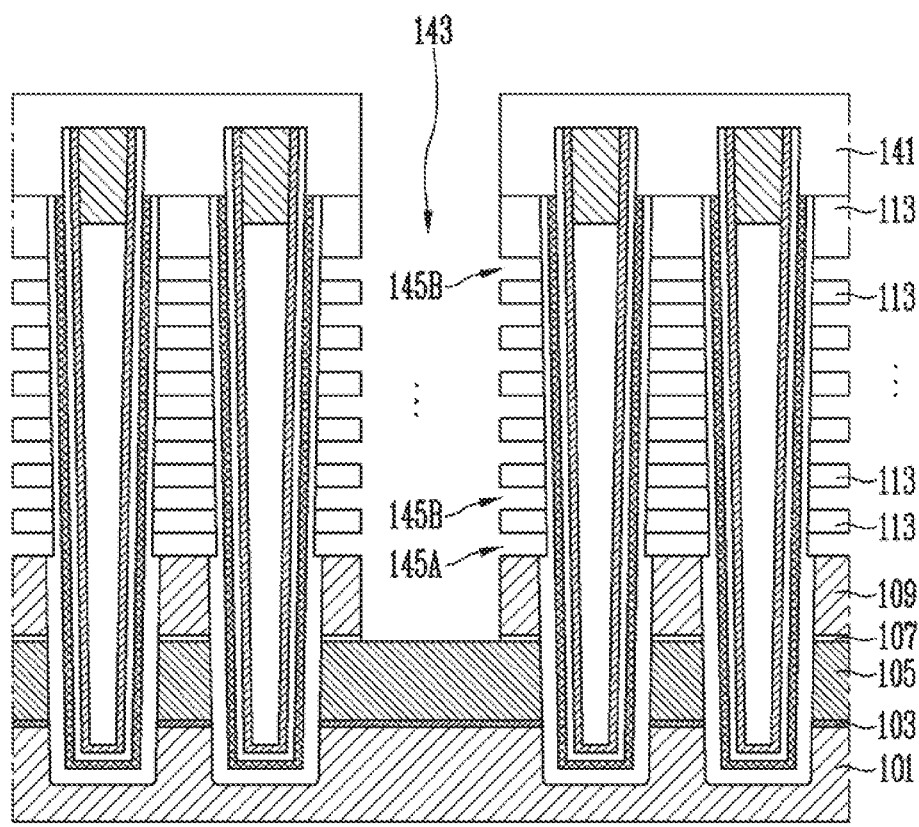
Figure 5H:
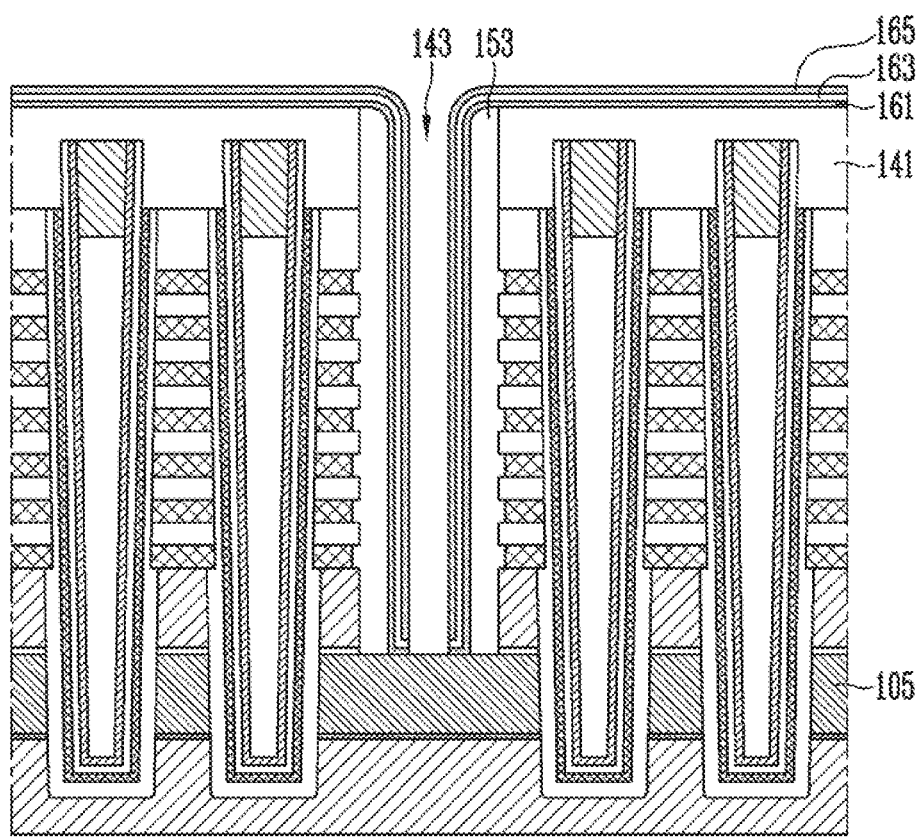
Figure 5I:
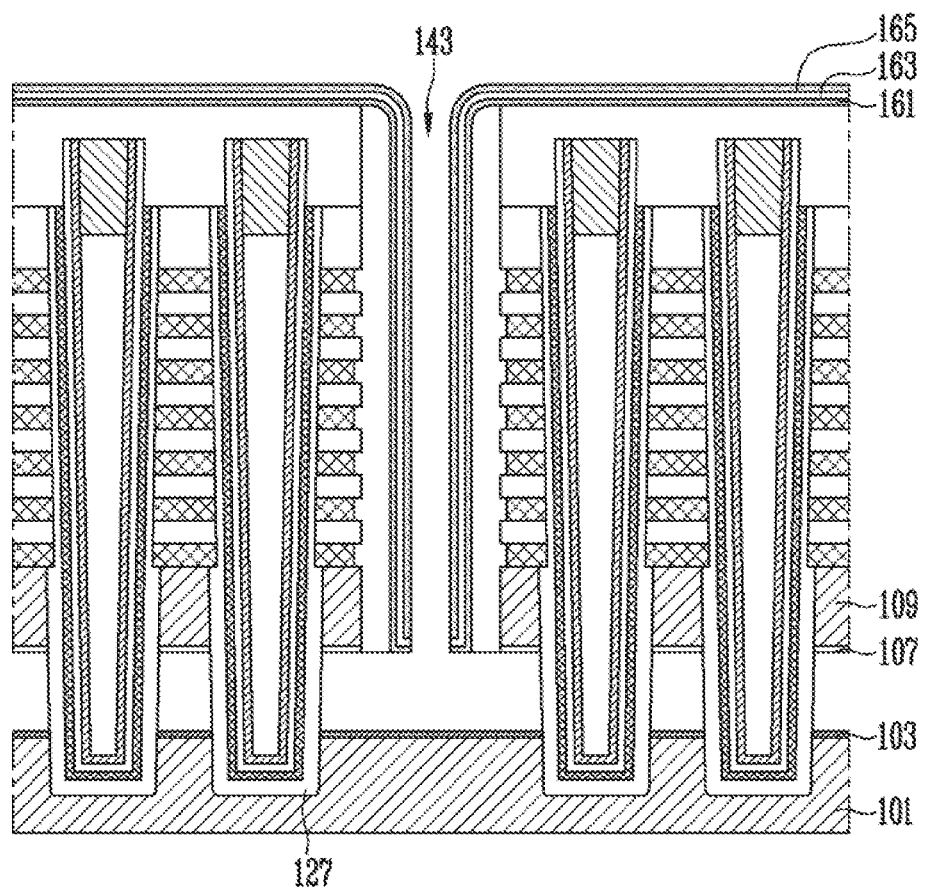
Figure 5K:
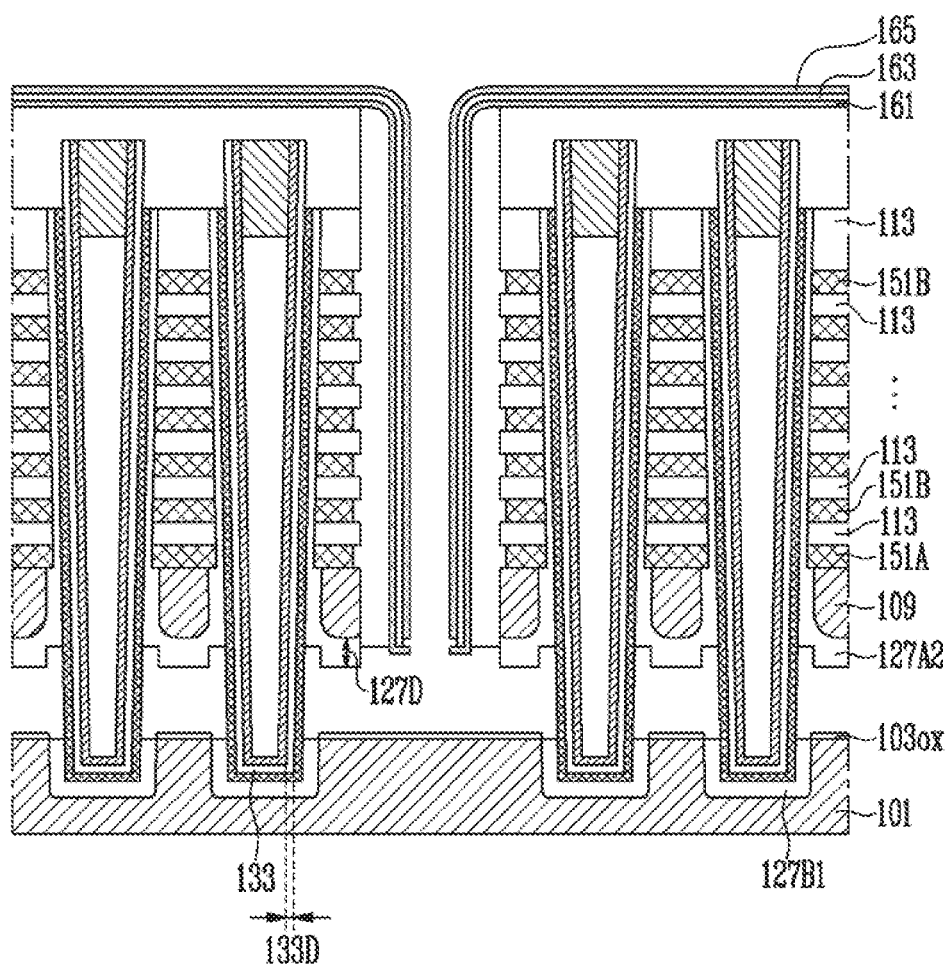
Figure 5L:
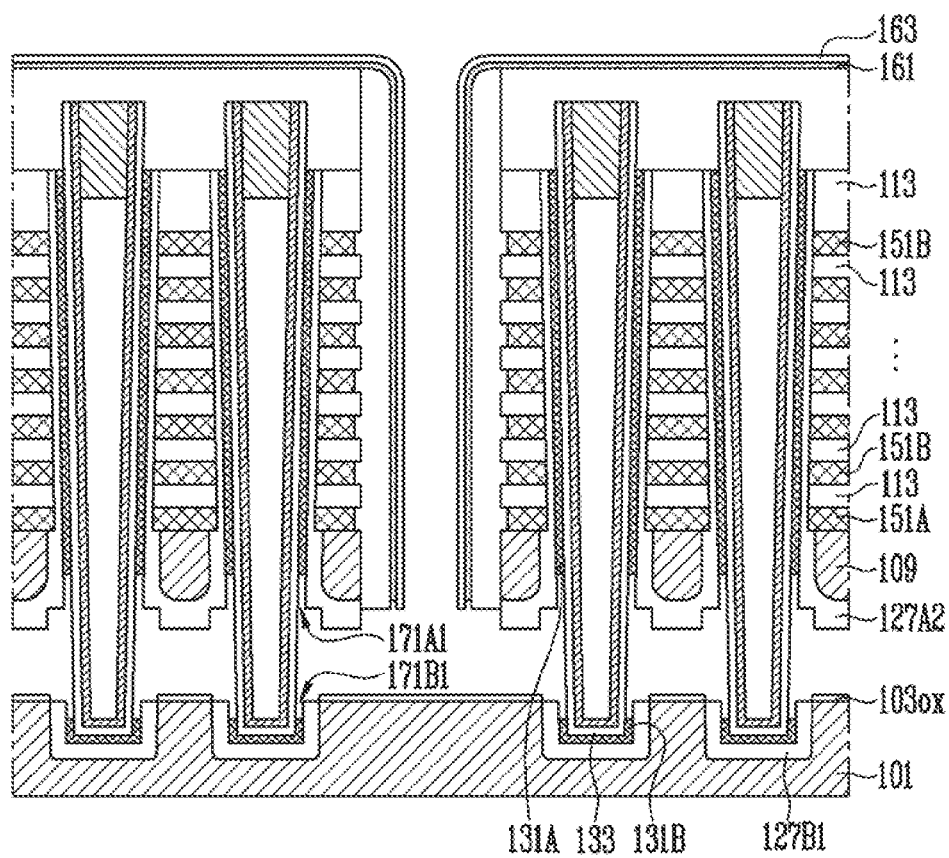
Figure 5M:
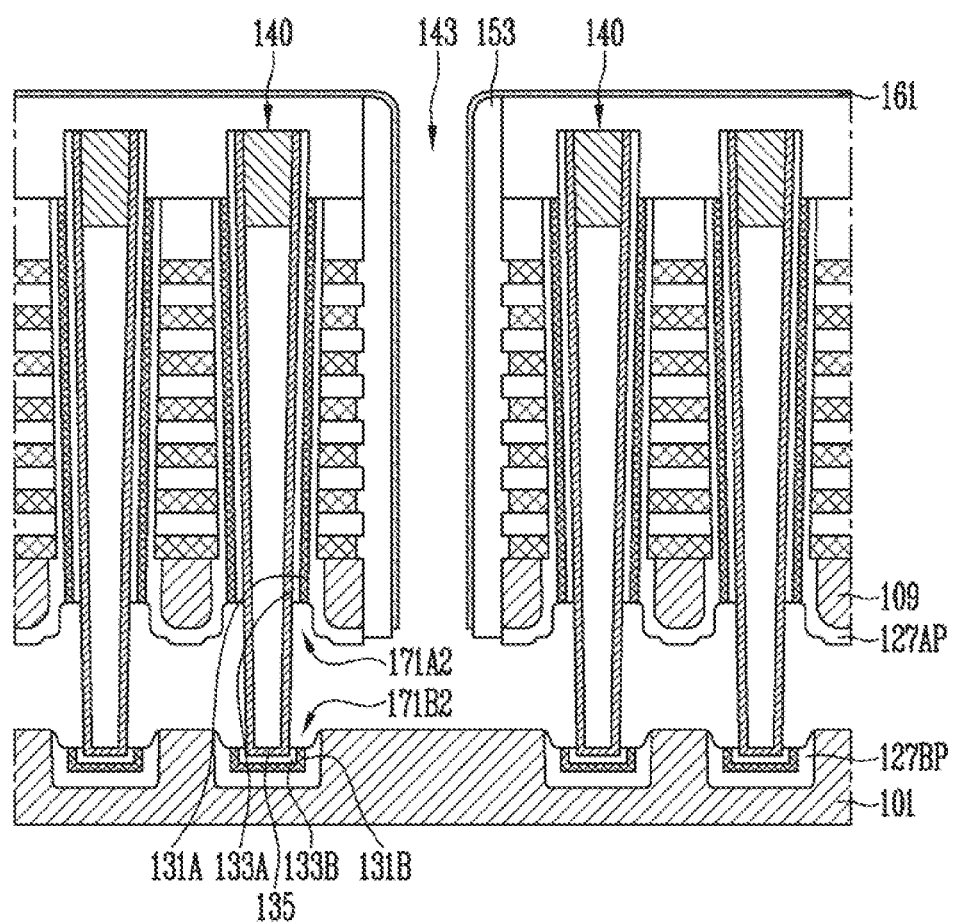
Figure 5N:
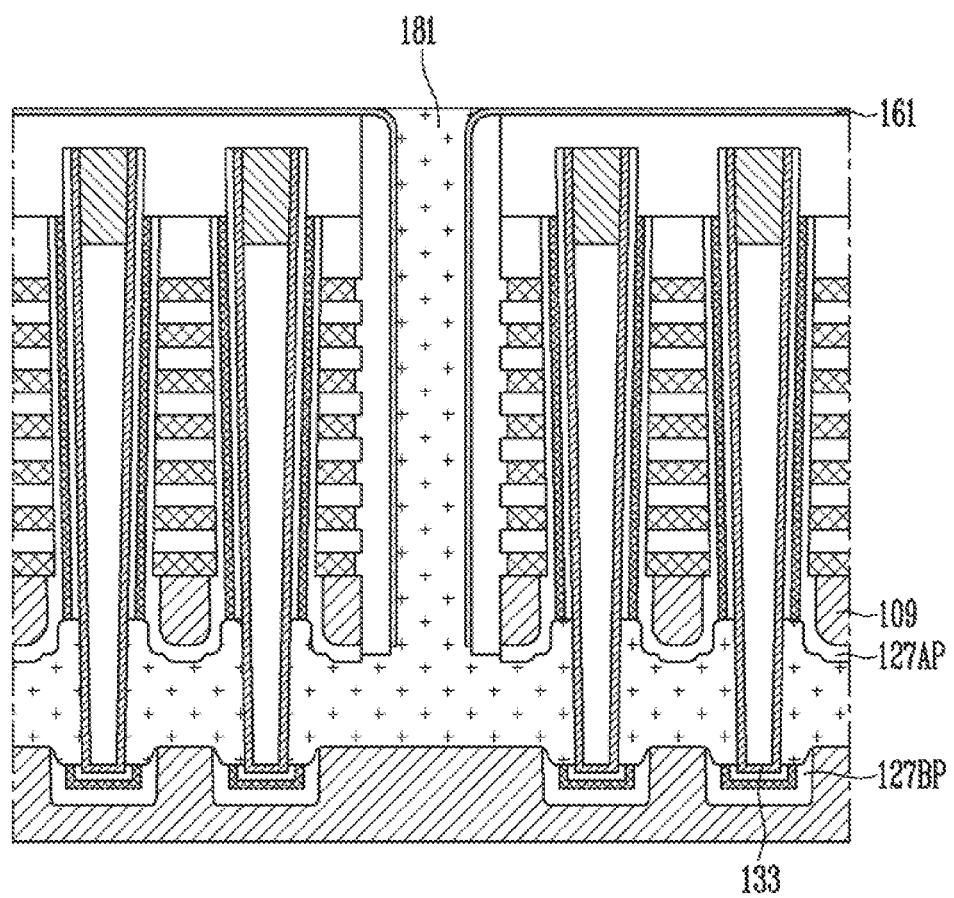

FIGS. 5A to 5N are sectional views illustrating a manufacturing method of the semiconductor memory device, in accordance with an embodiment of the present disclosure.

Referring to FIG. 5A, a sacrificial source layer 105 and a first select gate layer 109 may be sequentially formed on a source layer 101. Before the sacrificial source layer 105 is formed, a first protective layer 103 may be formed on the source layer 101. Before the first select gate layer 109 is formed, a second protective layer 107 may be formed on the sacrificial source layer 105.

The source layer 101 may include a semiconductor layer that is doped with an n-type impurity. In an embodiment, the source layer 101 may include an n-type doped silicon.

During a subsequent etching process for selectively removing the sacrificial source layer 105, the first protective layer 103 and the second protective layer 107 may be formed of a material that is capable of protecting the source layer 101 and the first select gate layer 109. In an embodiment, the first protective layer 103 may include a silicon oxynitride layer (SiCN), and the second protective layer 107 may include an oxide layer. In an embodiment, the sacrificial source layer 105 may include a silicon.

The first select gate layer 109 may have a large thickness in consideration of the height of a first groove 171A1 that is formed in a subsequent process shown in FIG. 5L. In an embodiment, the thickness of the first select gate layer 109 may be greater than the thickness of each of the sacrificial layers 111 that is formed in the subsequent process.

The first select gate layer 109 may include a material with a higher oxidation rate than a liner layer 125 that is formed in a subsequent process, shown in FIG. 5B. The first select gate layer 109 may include a conductive material that may be used as the gate electrode of the first select gate layer 109. In an embodiment, the first select gate layer 109 may include a doped silicon layer.

Subsequently, the sacrificial layers 111 and interlayer insulating layers 113 may be alternately stacked with each other on the first select gate layer 109. The sacrificial layers 111 may be formed of a material that is different from that of the interlayer insulating layers 113 to allow selective etching. In an embodiment, the interlayer insulating layers 113 may include an oxide layer such as silicon oxide, and the sacrificial layers 111 may include a nitride layer such as silicon nitride. The lowermost sacrificial layer of the sacrificial layers 111 may be disposed to be in contact with the first select gate layer 109.

Thereafter, a third protective layer 121 may be formed on the stack of the sacrificial layers 111 and the interlayer insulating layers 113.

Referring to FIG. 5B, channel holes 123 may be formed through the third protective layer 121, the sacrificial layers 111, and the interlayer insulating layers 113. The channel holes 123 may penetrate the first select gate layer 109, the second protective layer 107, the sacrificial source layer 105, and the first protective layer 103, and may extend into the source layer 101. Each of the channel holes 123 may expose sidewalls of the sacrificial layers 111, the interlayer insulating layers 113, the first select gate layer 109, and the sacrificial source layer 105.

Subsequently, the liner layer 125 may be formed on a surface of each of the channel holes 123. The liner layer 125 may extend onto the sidewalls of the sacrificial layers 111, the interlayer insulating layers 113, the first select gate layer 109, and the sacrificial source layer 105 that are exposed through the channel holes 123.

The liner layer 125 may be formed using a deposition method with a high-step coverage. In an embodiment, the liner layer 125 may be formed using Atomic Layer Deposition (ALD). The liner layer 125 may include a material with a lower oxidation rate than the first select gate layer 109. In an embodiment, the liner layer 125 may include a nitride layer.

Referring to FIG. 5C, the liner layer 125 and a portion of the first select gate layer 109, shown in FIG. 5B, may be oxidized through an oxidation process. During the oxidation process, a portion of each of the sacrificial source layer 105 and the source layer 101 may be oxidized.

The oxidation process may be performed to oxidize the first select gate layer 109 faster than the liner layer 125 as shown in FIG. 5B. In one embodiment, the oxidation process may include a radical oxidation process. The sacrificial source layer 105 and the source layer 101 with silicon may be oxidized faster than the liner layer 125, shown in FIG. 5B.

An insulating structure 127 may be formed to surround the center region of each of the channel holes 123 by the above described oxidation process. The insulating structure 127 may include an oxidized region of the liner layer 125, an oxidized region of the first select gate layer 109, an oxidized region of the sacrificial source layer 105, and an oxidized region of the source layer 101 as shown in FIG. 5B. Due to the difference in oxidation rates, the insulating structure 127 may be thicker at the sidewalls of the first select gate layer 109, the sacrificial source layer 105, and the source layer 101 than at the sidewall of each of the sacrificial layers 111. In an embodiment, a portion of the first select gate layer 109 that overlaps with the lowest layer of the sacrificial layer 111 may be oxidized by the oxidation process to form a portion of the insulating structure 127.

Referring to FIG. 5D, a data storage layer 131 and a tunnel insulating layer 133 may be sequentially stacked on the insulating structure 127. Subsequently, a channel structure 140 that fills each of the channel holes 123, shown in FIG. 5C, may be formed on the tunnel insulating layer 133.

The data storage layer 131 and the tunnel insulating layer 133 may include the same materials as the data storage layer DL and the tunnel insulating layer TL, respectively, as described with reference to FIG. 2.

A step of forming the channel structure 140 may include forming a channel layer 135 on the tunnel insulating layer 133, forming a core insulating layer 137 on the channel layer 135 to fill the center region of each of the channel holes 123 as shown in FIG. 5C, etching a portion of the core insulating layer 137 to open an upper end of each of the channel holes 123, and filling the opened upper end of each of the channel holes 123 with a capping semiconductor layer 139. The capping semiconductor layer 139 may include a doped semiconductor layer. In an embodiment, the capping semiconductor layer 139 may include an n-type doped silicon.

Each of the insulating structure 127, the data storage layer 131, the tunnel insulating layer 133, the channel layer 135, and the capping semiconductor layer 139 on the third protective layer 121 may be removed to expose the third protective layer 121. In this case, the uppermost interlayer insulating layer 113 may be protected by the third protective layer 121.

Referring to FIG. 5E, the third protective layer 121, shown in FIG. 5D, may be removed to expose the uppermost interlayer insulating layer 113. In this case, a portion of the insulating structure 127 and a portion of the data storage layer 131 may be removed.

Subsequently, a first upper insulating layer 141 may be formed on the uppermost interlayer insulating layer 113. The first upper insulating layer 141 may extend to cover the channel structure 140.

Referring to FIG. 5F, a slit 143 that penetrates the first upper insulating layer 141, the sacrificial layers 111, and the interlayer insulating layers 113, shown in FIG. 5E, may be formed. The slit 143 may extend to penetrate the first select gate layer 109.

Subsequently, the sacrificial layers 111, shown in FIG. 5E, may be selectively removed through the slit 143. As a result, a first horizontal space 145A may be open between the first select gate layer 109 and the lowest layer interlayer insulating layer 113, and second horizontal spaces 145B may be open between the adjacent interlayer insulating layers 113.

Referring to FIG. 5G, a second select gate layer 151A may be formed in the first horizontal space 145A, shown in FIG. 5F, and conductive patterns 151B may be formed in each of the second horizontal spaces 145B, shown in FIG. 5F.

A step of forming the second select gate layer 151A and the conductive patterns 151B may include forming a conductive material that fills the first horizontal space 145A and the second horizontal spaces 145B, shown in FIG. 5F and removing a portion of the conductive material that is disposed inside the slit 143 so that the conductive material is separated into the second select gate layer 151A and the conductive patterns 151B.

As described above, each of the sacrificial layers is replaced with a conductive material through the slit 143, and the conductive material is separated into the second select gate layer 151A and the conductive patterns 151B.

Subsequently, a spacer insulating layer 153 may be formed on the sidewalls of the slit 143. A step of forming the spacer insulating layer 153 may include forming the insulating layer on the surface of the slit 143, and etching the insulating layer to expose the sacrificial source layer 105.

Referring to FIG. 5H, first, second, and third etching barrier layers 161, 163, and 165 may be sequentially stacked on the spacer insulating layer 153. The first, second, and third etching barrier layers 161, 163, and 165 may extend to overlap with the first upper insulating layer 141.

Each of the first, second, and third etching barrier layers 161, 163, and 165 may include materials that are capable of protecting the spacer insulating layer 153 during subsequent etching processes, shown in FIGS. 5J, and 5L to 5M, In an embodiment, each of the first etching barrier layer 161 and the third etching barrier layer 165 may include a nitride layer, and the second etching barrier layer 163 may include an oxide layer.

A portion of each of the first, second, and third etching barrier layers 161, 163, and 165 may be etched to expose the sacrificial source layer 105 through the bottom surface of the slit 143.

Referring to FIG. 5I, the insulating structure 127, the first protective layer 103, and the second protective layer 107 may be exposed by removing the sacrificial source layer 105, shown in FIG. 5H, through the slit 143. While removing the sacrificial source layer 105, the source layer 101 and the first select gate layer 109 may be protected by the first protective layer 103 and the second protective layer 107, respectively.

Referring to FIG. 5J, an exposed region of the insulating structure 127, shown in FIG. 5I, may be removed by an etching process to expose the data storage layer 131. In an embodiment, the etching process may be performed through a dry-cleaning process. The insulating structure 127 may be separated into a first insulating pattern 127A1 and a second insulating pattern 127B1 through the etching process.

The first insulating pattern 127A1 may be disposed between the first select gate layer 109 and the data storage layer 131. The first insulating pattern 127A1 may extend between the second select gate layer 151A and the data storage layer 131, between the interlayer insulating layers 113 and the data storage layer 131, and between the conductive patterns 151B and the data storage layer 131. The second insulating pattern 127B1 may be disposed between the source layer 101 and the data storage layer 131.

During the etching of the insulating structure 127, the second protective layer 107, shown in FIG. 5I, may be removed, thereby exposing the bottom surface of the first select gate layer 109. The first protective layer 103 may have etching resistance against the material used to etch the insulating structure 127. Accordingly, the first protective layer 103 may remain. During the etching of the insulating structure 127, the spacer insulating layer 153 may be protected by the third etching barrier layer 165.

Referring to FIG. 5K, the first insulating pattern 127A1, shown in FIG. 5J, may extend by selectively oxidizing the first select gate layer 109. An extended first insulating pattern 127A2 may include a region oxidized from the bottom surface of the first select gate layer 109. While the first select gate layer 109 is selectively oxidized, the first protective layer 103, shown in FIG. 5I, may be oxidized to form an oxide layer 103ox.

A selective oxidation process of the first select gate layer 109 may be controlled so that a thickness 127D of the extended first insulating pattern 127A2 may be larger than the thickness 133D of the tunnel insulating layer 133. In an embodiment, the first select gate layer 109 may be selectively oxidized by a wet oxidation method. In an embodiment, the thickness 127D of the extended first insulating pattern 127A2 may be twice or more than the thickness 133D of the tunnel insulating layer 133.

Referring to FIG. 5L, the tunnel insulating layer 133 may be exposed by removing a portion of the data storage layer 131 that is exposed between the extended first insulating pattern 127A2, shown in FIG. 5K, and the second insulating pattern 127B1 through an etching process. The etching process of the data storage layer 131 may be performed through a wet cleaning process. During the etching of the data storage layer 131, the third etching barrier layer 165, shown in FIG. 5K, may be removed. Accordingly, the second etching barrier layer 163 may be exposed.

By the etching process of the data storage layer 131, the data storage layer 131 may be separated into a first data storage pattern 131A and a second data storage pattern 131B. The first data storage pattern 131A1 may be disposed between the first select gate layer 109 and the tunnel insulating layer 133. The first data storage pattern 131A1 may extend between the second select gate layer 151A and the tunnel insulating layer 133, between each of the interlayer insulating layers 113 and the tunnel insulating layer 133, and between each of the conductive patterns 151B and the tunnel insulating layer 133. The second data storage pattern 131B1 may be disposed between the source layer 101 and the tunnel insulating layer 133.

The bottom surface of the first data storage pattern 131A may be disposed at a higher level than the bottom surface of the first select gate layer 109 that remains without oxidation. Accordingly, the first groove 171A1 may be defined between the tunnel insulating layer 133 and the first select gate layer 109. When the data storage layer 131 is etched to define the first groove 171A1, a second groove 171B1 may be defined between the tunnel insulating layer 133 and the source layer 101.

Referring to FIG. 5M, the sidewalls of the channel structure 140 may be exposed by removing a portion of the tunnel insulating layer 133 that is exposed between the first data storage pattern 131A and the second data storage pattern 131B, shown in FIG. 5L, through an etching process. The etching process of the tunnel insulating layer 133 may be performed through a dry-cleaning process. During the etching of the tunnel insulating layer 133, the second etching barrier layer 163, shown in FIG. 5L, may be removed. Accordingly, the first etching barrier layer 161 may be exposed. During the etching of the tunnel insulating layer 133, the spacer insulating layer 153 may be protected by the first etching barrier layer 161.

Through the etching process of the tunnel insulating layer 133, the tunnel insulating layer 133 may be separated into a first tunnel insulating pattern 133A and a second tunnel insulating pattern 1333. A first tunnel insulating pattern 133A may be disposed between the first data storage pattern 131A and the channel layer 135, and a second tunnel insulating pattern 1333 may be disposed between the second data storage pattern 131B and the channel layer 135.

During the etching of the tunnel insulating layer 133, the first groove 171A1 and the second groove 171B1, shown in FIG. 5M, may be expanded. A portion of the sidewall of the channel layer 135 that faces the sidewall of the first select gate layer 109 may be exposed by the extended first groove 171A2, and a portion of the sidewall of the channel layer 135 that faces the sidewall of the source layer 101 may be exposed by an extended second groove 171B2.

During the etching of the tunnel insulating layer 133, the extended first insulating pattern 127A2 and the second insulating pattern 127B1, shown in FIG. 5M, may be etched. Because the extended first insulating pattern 127A2 is thicker than the tunnel insulating layer 133, the extended first insulating pattern 127A2 might not be completely removed while the tunnel insulating layer 133 is etched, and the extended first insulating pattern 127A2 may remain as a first target insulating pattern 127AP. Accordingly, the present disclosure may secure a breakdown voltage of the first target insulating pattern 127AP. The second insulating pattern 127B1 may remain as a second target insulating pattern 127BP.

Referring to FIG. 5N, an extended first groove 171A2 and the extended second groove 171B2, shown in FIG. 5M, may be filled with a source-channel contact layer 181. The source-channel contact layer 181 may extend to fill the interior of the slit 143, shown in FIG. 5M, The source-channel contact layer 181 may extend to surround the sidewall of the channel layer 133 that is exposed between the first target insulating pattern 127AP and the second target insulating pattern 127BP.

The source-channel contact layer 181 may include a doped semiconductor layer with an n-type impurity. In an embodiment, the source-channel contact layer 181 may include an n-type doped silicon.

According to an embodiment of the present disclosure, a junction overlap region may be formed by the source-channel contact layer 181 that fills the extended first groove 171A2. Compared to using a diffusion process by a thermal process, the range of the junction overlap region may be more uniformly controlled when controlled using the etching process as in the embodiment of the present disclosure. Accordingly, the present disclosure may easily control the GIDL current and may easily control the off characteristic of the select transistor that is connected to the first select gate layer 109.

Figure 6:
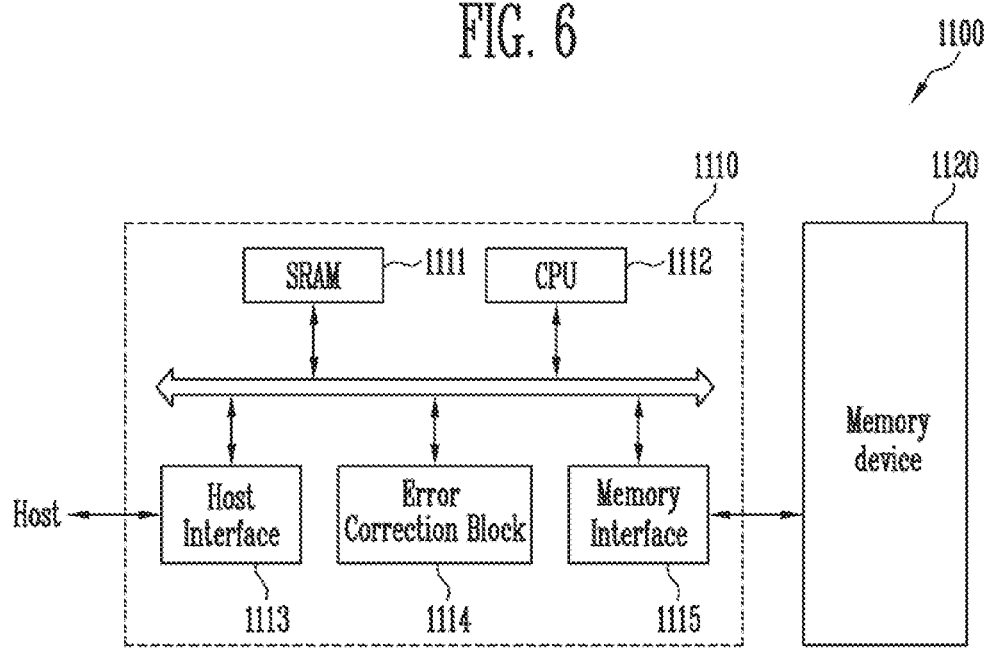
FIG. 6 is a block diagram illustrating a configuration of a memory system, in accordance with an embodiment of the present disclosure.

FIG. 6 is a block diagram illustrating a configuration of a memory system 1100, in accordance with an embodiment of the present disclosure.

Referring to FIG. 6, the memory system 1100 may include a memory device 1120 and a memory controller 1110.

The memory device 1120 may include the structure described with reference to FIGS. 2 to 4. In an embodiment, the memory device 1120 may include a first select gate layer that surrounds a channel structure, a stack that surrounds the channel structure and overlaps with the first select gate layer, and an insulating pattern. The insulating pattern may include a first portion between the first select gate layer and the channel structure, and a second portion between the stack and the channel structure. The first portion of the insulating pattern may be thicker than the second portion of the insulating pattern. The memory device 1120 may be a multi-chip package configured with a plurality of flash memory chips.

The memory controller 1110 may be configured to control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host that is connected to the memory system 1100. The error correction block 1114 may detect and correct an error that is included in a data that is read from the memory device 1120, and the memory interface 1115 may interface with the memory device 1120. In addition, the memory controller 1110 may further include a Read Only Memory (ROM) for storing code data for interfacing with the host, and the like.

The memory system 1100, configured as described above, may be a memory card or a Solid State Drive (SSD), in which the memory device 1120 may be combined with the memory controller 1110. For example, when the memory system 1100 is an SSD, the memory controller 1100 may communicate with an exterior device (e.g., the host) through one among various interface protocols, such as a Universal Serial Bus (USB) protocol, a Multi-Media Card (MMC) protocol, a Peripheral Component Interconnection-Express (PCI-E) protocol, a Serial Advanced Technology Attachment (SATA) protocol, a Parallel Advanced Technology Attachment (PATA) protocol, a Small Computer Small Interface (SCSI) protocol, an Enhanced Small Disk Interface (ESDI) protocol, and an Integrated Drive Electronics (IDE) protocol.

Figure 7:
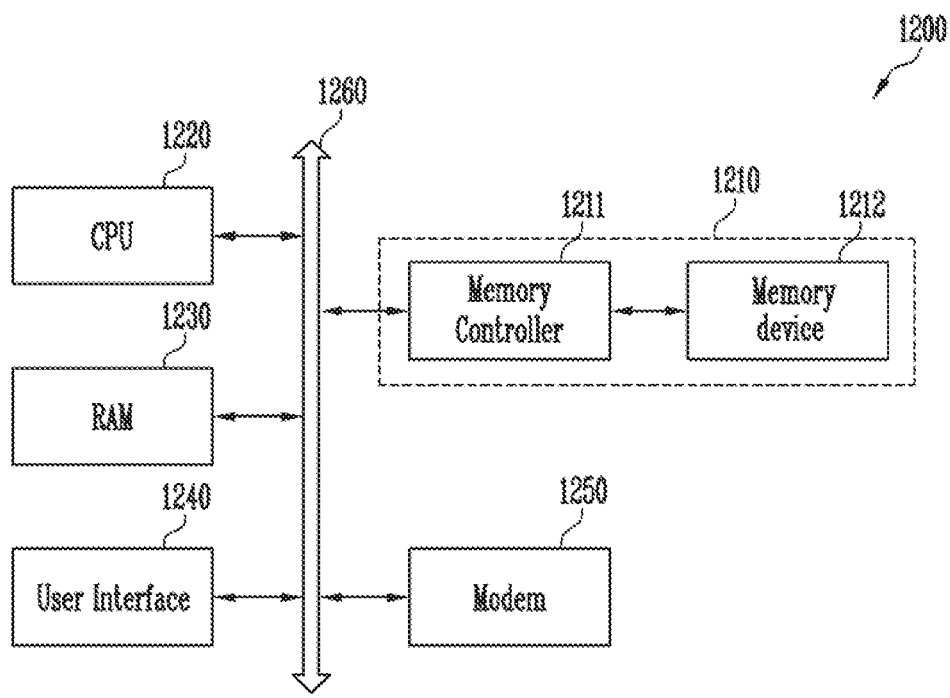
FIG. 7 is a block diagram illustrating a configuration of a computing system, in accordance with an embodiment of the present disclosure.

FIG. 7 is a block diagram illustrating a configuration of a computing system 1200, in accordance with an embodiment of the present disclosure.

Referring to FIG. 7, the computing system 1200 may include a CPU 1220, a Random Access Memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

As described with reference to FIG. 6, the memory system 1210 may be configured with a memory device 1212 and a memory controller 1211.

Embodiments of the present disclosure may form the insulating structure on the surface of the select gate layer by selectively oxidizing the select gate layer. The embodiments of the present disclosure is capable of controlling the oxide thickness of the select gate layer, considering that the insulating structure formed on the surface of the select gate layer may be lost due to an etching process for exposing the channel structure. Accordingly, the embodiments of the present disclosure may ensure a breakdown voltage of the insulating structure remaining on the surface of the select gate layer, thereby improving operational reliability of the semiconductor memory device.

What is claimed is:

1. A semiconductor memory device comprising:
   a source layer;
   a channel structure extending in a first direction from within the source layer;
   a source-channel contact layer surrounding the channel structure, on the source layer;
   a first select gate layer overlapping with the source-channel contact layer and surrounding the channel structure;
   a stack including interlayer insulating layers and conductive patterns that are alternately stacked in the first direction and surrounding the channel structure, the stack overlapping with the first select gate layer; and
   a first insulating pattern that is formed thicker between the first select gate layer and the channel structure than between the stack and the channel structure.

2. The semiconductor memory device of claim 1, wherein the first insulating pattern includes a first portion between the first select gate layer and the channel structure, a second portion disposed between the stack and the channel structure, and a third portion disposed between the first select gate layer and the source-channel contact layer,
   wherein the first portion of the first insulating pattern is thicker than the second portion.

3. The semiconductor memory device of claim 2, wherein the stack extends toward the channel structure to overlap with the first portion of the first insulating pattern.

4. The semiconductor memory device of claim 2, wherein the third portion of the first insulating pattern has an uneven surface in contact with the source-channel contact layer.

5. The semiconductor memory device of claim 1, further comprising:
   a data storage layer disposed between the first insulating pattern and the channel structure on the source-channel contact layer; and
   a tunnel insulating layer disposed between the data storage layer and the channel structure on the source-channel contact layer.

6. The semiconductor memory device of claim 5, wherein the source-channel contact layer protrudes toward the data storage layer and the tunnel insulating layer.

7. The semiconductor memory device of claim 2, wherein the third portion of the first insulating pattern extends along a bottom surface of the first select gate layer facing the source layer.

8. The semiconductor memory device of claim 1, further comprising a second select gate layer surrounding the channel structure between the first select gate layer and the stack,
   wherein the first select gate layer and the second select gate layer form a source select line.

9. The semiconductor memory device of claim 8, wherein the portion of the first insulating pattern between the stack and the channel structure extends in between the second select gate layer and the channel structure.

10. The semiconductor memory device of claim 1, further comprising a second insulating pattern that is disposed between the source layer and the channel structure, the insulating pattern being thicker than the second portion of the first insulating pattern between the stack and the channel structure.

* * * * *